United States Patent [19]

Schmitt et al.

[11] Patent Number: 4,971,887

[45] Date of Patent: Nov. 20, 1990

[54] POSITIVE-WORKING PHOTOSENSITIVE MIXTURE AND RECORDING MATERIAL OF HIGH THERMAL STABILITY WITH PHENOLIC NOVOLAK OF M-CRESOL AND 2,3,6-TRIALKYLPHENOL

[75] Inventors: Axel Schmitt, Walluf; Wolfgang Zahn, Eltville; Burkhard Behrens, Wiesbaden, all of Fed. Rep. of Germany

[73] Assignee: Hoechst Aktiengesellschaft, Frankfurt am Main, Fed. Rep. of Germany

[21] Appl. No.: 330,173

[22] Filed: Mar. 29, 1989

[30] Foreign Application Priority Data

Mar. 29, 1988 [DE] Fed. Rep. of Germany ....... 3810631

[51] Int. Cl.$^5$ .................... G03C 1/60; G03F 7/023
[52] U.S. Cl. .................... 430/165; 430/191; 430/192; 430/193; 430/326; 430/330
[58] Field of Search ..................... 430/192, 193, 165

[56] References Cited

U.S. PATENT DOCUMENTS

| | | | |
|---|---|---|---|
| 3,779,778 | 12/1973 | Smith et al. | 96/115 R |
| 4,101,323 | 7/1978 | Buhr et al. | 96/35 |
| 4,247,611 | 1/1981 | Sander et al. | 430/286 |
| 4,248,957 | 2/1981 | Sander et al. | 430/270 |
| 4,250,247 | 2/1981 | Sander et al. | 430/270 |
| 4,311,782 | 1/1982 | Buhr et al. | 430/270 |
| 4,377,631 | 3/1983 | Toukhy et al. | 430/192 |
| 4,529,682 | 7/1985 | Toukhy | 430/190 |
| 4,587,196 | 5/1986 | Toukhy | 430/192 |
| 4,719,167 | 1/1988 | Miura et al. | 430/192 |
| 4,737,426 | 4/1988 | Roth | 430/270 |
| 4,812,551 | 3/1989 | Oi et al. | 430/192 |

FOREIGN PATENT DOCUMENTS

| | | | |
|---|---|---|---|
| 0239423 | 9/1987 | European Pat. Off. | 430/192 |
| 60-57339 | 4/1985 | Japan | 430/192 |

OTHER PUBLICATIONS

English Abstract of West German Publication #3,544,165, Published 6/26/86 (Aoai et al.).
English Abstract of West German Publication #3,601,264, Published 7/24/86 (Aoai).
English Abstract of West German Publication #3,626,582, Published 2/19/87 (Kohara et al.).
English Abstract of Japanese Publication #60-164,740, Published 8/27/85 (Japan Synthetic Rubber).
English Abstract of West German Publication #2,616,992, Published 11/3/77 (Agfa—Gevaert).

Primary Examiner—Charles L. Bowers, Jr.
Attorney, Agent, or Firm—Foley & Lardner, Schwartz, Jeffery, Schwaab, Mack, Blumenthal & Evans

[57] ABSTRACT

A positive-working photosensitive mixture is disclosed, which comprises an o-quinonediazide as the photosensitive compound and a novolak resin, which is insoluble in water and soluble in aqueous-alkaline media, as a binder, said novolak resin being prepared by condensation of a mixture comprising m-cresol and 2,3,6-trialkylphenol with a carbonyl component, preferably in a solvent. The photosensitive mixture containing the above-described binder is distinguished by high thermal stability and by a low dark erosion rate when developed with a metal ion-free developer.

14 Claims, No Drawings

POSITIVE-WORKING PHOTOSENSITIVE MIXTURE AND RECORDING MATERIAL OF HIGH THERMAL STABILITY WITH PHENOLIC NOVOLAK OF M-CRESOL AND 2,3,6-TRIALKYLPHENOL

BACKGROUND OF THE INVENTION

The present invention relates to a positiveworking photosensitive mixture comprising an o-quinonediazide as the photosensitive compound and a binder of the novolak type, which is insoluble in water and soluble in aqueous-alkaline media.

Due to the continued miniaturization in semiconductor technology, photosensitive mixtures have to satisfy increasing demands in respect of both image resolution and processing methods. Because of their better resolution, positive-working mixtures have been able to gain more and more importance over negative-working mixtures. It is also observed that the wet isotropic etching processes, which lead to undercuttings, are increasingly ousted by anisotropic etching processes, such as plasma etching and reactive ion etching. For these new process methods the quality of the photosensitive mixtures (photoresists) must be further improved, in particular in respect of plasma etch resistance and thermal stability.

Positive-working photosensitive mixtures containing compounds which upon exposure set free an acid, in combination with acid-cleavable compounds, such as acetals and ortho-carboxylates, and relatively high amounts of novolak resins, are known.

Photosensitive mixtures of this type are, for example, described in EP-A-0,022,571; 0,006,626; 0,006,627 and 0,202,196; in DE-A-2,610,842; 3,544,165 and 3,601,264; in DE-C-2,306,248 and 2,718,254 and in German Patent Applications P 3,730,783.5 and P 3,730,785.1

However, most of the prior art publications describe photosensitive mixtures which contain an o-quinonediazide as the photosensitive compound and a resin of the phenol or cresol novolak type as the binder.

In the patent literature numerous examples are disclosed of how the photolithographic properties of a photosensitive mixture can be modified by modifying the binder which is soluble in aqueous-alkaline media. The criteria mentioned in general are resolution, resistance to developer, contrast, and photosensitivity.

An increased photosensitivity of positive-working photosensitive mixtures is claimed to be achieved by selecting certain mixture: comprising m-cresol/p-cresol or m-cresol/p-cresol/o-cresol, respectively, (EP-A-0,070,624).

By the selection of certain m-cresol/p-cresol mixtures, high resolution due to relief patterns with well-defined edges is claimed to be accomplished for positive-working photosensitive materials in DE-A-36 26 582.

Well-defined edge lines are also claimed to be achieved employing the positive-working photosensitive mixtures known from DE-A-36 03 372, by selecting a novolak resin comprised of m-cresol/p-cresol in combination with 2,5-xylenol.

Novolak resins comprised of m-cresol/p-cresol mixtures in combination with xylenols and condensed with aldehydes are also described in JP-A-16 4740/1985. This publication claims an improved resistance to developer and high photosensitivity for the photosensitive positive-working mixtures disclosed therein.

However, none of the resists prepared from the positive-working photosensitive mixtures described above is distinguished by good thermal stability.

According to DE-A-26 16 992, thermal stability is said to be improved by higher molecular-weight novolaks comprising mono-alkylated alkyl phenols, the alkyl groups of which are in the m- or p-position relative to phenolic hydroxy groups and thus are bireactive (towards nucleophilic reactants).

It is also claimed that novolak resins contained in positive-working photosensitive mixtures, and comprising m-cresol/formaldehyde resins having molecular weights of between 5,000 and 30,000 exhibit both good thermal stability and high photosensitivity (JP-A-57339/1985). Mixtures of this type possess, however, an unsatisfactory resistance to developer, for example, when metal ion-free developers are employed.

Photosensitive mixtures containing pure m-cresol novolak resins as binder, whereby these novolaks have average molecular weights and a low polydispersity, are also said to possess high thermal stability. It has, however, been observed that layers prepared using these mixtures are severely abraded by metal ion-free developers.

Novolak resins obtained from m-cresol and other alkyl-phenols, of a specific molecular weight distribution, are described in EP-A-0,239,423. They are also claimed to possess high thermal stability and good photosensitivity, as well as good resolution.

The state of the art described above in all cases relates to novolak resins which in addition to m-cresol contain bi- or trireactive phenols as monomer components, since at least bireactive reactive monomers are required apart from the aldehyde or ketone component in order to build up a polycondensate chain.

EP-A-0,239,423 for the first time mentions the use of monoreactive phenols, such as 2,4-or 2,6-dimethylphenol, apart from the known m-cresol, for building up novolak resins. Positive-working photosensitive mixtures wherein these resins are contained as binders show, however, a strong dark erosion rate when metal ion-free developers are used. When the dark erosion rate is too high it is no longer possible to achieve a good differentiation between the exposed and unexposed areas of the recording material, i.e., the contrast achieved by development is reduced.

SUMMARY OF THE INVENTION

Accordingly, it is an object of the present invention to provide a positive-working photosensitive mixture exhibiting high thermal stability and a low dark erosion rate during development with a metal ion-free developer.

In accomplishing the foregoing objective, there has been provided, in accordance with one aspect of the present invention, a positive-working photosensitive mixture which comprises a photosensitive o-quinonediazide compound, and a novolak resin binder which is insoluble in water and soluble in aqueous-alkaline media and which is a polymer of (i) a carbonyl component and (ii) a phenol component which comprises a mixture of m-cresol and a 2,3,6-trialkylphenol.

In accordance with another aspect of the present invention, there is provided a photosensitive recording material which comprises a support and a photosensitive layer comprising the above-recited photosensitive mixture.

In accordance with yet another aspect of the present invention, there is provided a process for producing a positive-working photosensitive recording material which comprises the steps of providing a photosensitive mixture as recited above, applying the mixture to a support, and drying the mixture on the support.

Other objects, features and advantages of the present invention will become apparent to those skilled in the art from the following detailed description. It should be understood however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF THE PREFERRED EMBODIMENTS

It was completely surprising to find that by the addition of a monoreactive phenol, such as a 2,3,6-trialkylphenol, both high thermal stability and a low dark erosion rate during development in a metal ion-free developer are achieved.

This discovery was all the more surprising, since resins containing other monoreactive phenol components do not have this profile of properties (see EP-A-0,239,423).

The thermal stability is in general determined by the glass transition temperature of the resin. For the novolak resins contained in the photosensitive mixture of this invention, it is at least 110° C. Glass transition temperatures of at least 115° C. are particularly preferred.

In a preferred embodiment, the novolak resins contained in the photosensitive mixtures according to this invention are prepared from a mixture comprising about 75 to 95 mol-% of m-cresol and about 5 to 25 mol-% of 2,3,6-trialkylphenol. Particular preference is given to mixtures comprising 80 to 92 mol-% of m-cresol and 8 to 20 mol-% of 2,3,6-trialkylphenol. If the content of 2,3,6-trialkylphenols rises above about 25 mol-%, it becomes difficult to prepare a novolak resin having a sufficiently high degree of condensation from the mixture (because it is a monoreactive derivative).

2,3,6-trialkylphenols having $C_1$ to $C_3$)alkyl groups, which are the same or different, are particularly preferred, and most preferably, the alkyl is methyl.

The novolak resins contained in the photosensitive mixture of this invention are prepared by condensing the described phenol mixtures with carbonyl components. Examples of suitable carbonyl components include formaldehyde and derivatives thereof, such as paraformaldehyde and trioxane, acetaldehyde, propyl aldehyde, acrolein, tenzaldehyde, 4-hydroxybenzaldehyde, acetone, methyl ethyl ketone, diethyl ketone, methyl isobutyl ketone, acetophenone, benzyl methyl ketone, and the like, which can be used either by themselves or as a mixture. It is also possible to employ the acetals of the carbonyl compounds listed above.

Particular preference is given to formaldehyde and paraformaldehyde.

The molar ratio of the carbonyl component(s) to the phenol component(s) used is about (0.80 to 0.93) to 1 (initially added amount). Preferably, a ratio of 0.9 mol 1 mol (carbonyl component:phenol component) is used.

The mixture, from which the novolak resins contained in the photosensitive mixtures according to this invention are prepared, usually contains an acid as a catalyst. Examples of suitable acids include organic acids, such as maleic anhydride, oxalic acid, formic acid, acetic acid, trifluoroacetic acid, methanesulfonic acid, toluenesulfonic acid, and also inorganic acids, such as sulfuric acid and phosphoric acid. Oxalic acid is preferred.

The acids are added in amounts varying between about $10^{-4}$ mol and $10^{-1}$ mol per 1 mol of phenol compound, amounts between $10^{-3}$ mol and $5 \times 10^{-2}$ mol per 1 mol of phenol compound being particularly preferred.

It is advantageous to perform the condensation between the phenol components and the carbonyl component in the presence of solvents. The boiling points of the solvents are in the range of about 120° C. to 200° C. in particular of 140° C. to 190° C. The solvents are selected such that the novolak resins are readily soluble therein. Examples of suitable solvents are glycol ethers, such as methylglycol, ethylglycol, butylglycol, methoxybutanol, dimethylformamide, diethylene glycol dimethyl ether, ethylglycol acetate and methylpropylene glycol acetate. Preferably, hydroxyl-free solvents are used; they are used in amounts of about 0.2 to 1.0 part by weight per 1 part by weight of phenol mixture.

The photosensitive mixtures according to this invention use o-quinonediazides as photosensitive compounds. These compounds may be employed alone or in admixture with several other o-quinonediazides.

The compounds comprise the aromatic and aliphatic amides and esters of o-naphthoquinonediazides or of o-benzoquinonediazides. Bis-1,2-naphthoquinone-2-diazide-sulfonic acid amides are, for example, described in EP-A-0,231,855. Preference is, however, given to the esters of mono- and polyhydroxybenzophenones mono- and polyhydroxyacylophenones, gallic acids, phloroglucine, mono- and polyhydroxydiphenylmethanes and and bis(-hydroxyphenyl)valeric acid. Of these, the polyhydroxybenzophenone and polyhydroxyacylophenone esters are preferred. Particular preference is given to the trihydroxy compounds especially trihydroxybenzophenone, and most preferred are the triesters of o-naphtho- and o-benzoquinonediazide sulfonic acids. Diazide-4- and diazide-5-sulfonic acid esters may be used, but mixed esters, in particular triesters of the 4- and 5-sulfonic acids are also suitable. Compounds of this type are described in DE-C Nos. 938,239; 21 31 377; 25 47 905 and 28 28 017.

The photosensitive mixture according to the invention contains about 5 to 100, and in particular 10 to 60, parts by weight of o-quinonediazide per 100 parts by weight of novolak resin.

Furthermore, it is possible to add to the photosensitive mixtures according to the invention, if desired, dyes, pigments, surfactants and leveling agents, for improving special requirements such as flexibility, adhesion and gloss.

Preferably, the radiation-sensitive mixture according to the invention is dissolved in solvents such as ethylene glycol, glycol ethers such as glycol monomethyl ether, glycol dimethyl ether, glycol monoethyl ether or propylene glycol monoalkyl ethers in particular propylene glycol methyl ether; aliphatic esters such as ethyl acetate, hydroxyethyl acetate, alkoxyethyl acetate, $\gamma$-butyl acetate, propylene glycol monoalkyl ether; acetate, in particular propylene glycol methyl ether acetate or amyl acetate; ethers such as dioxane, ketones such as methyl ethyl ketone, methyl isobutyl ketone, cyclopentanone and cyclohexanone; dimethylformamide, dimethylacetamide, hexamethyl-phosphoric amide, N-methylpyrrolidone, butyrolactone, tetrahydrofuran and in mixtures thereof. Particular preference is given to glycol ethers, aliphatic esters and ketones.

The solutions which are formed together with the other components of the photosensitive mixture usually have a solids content of about 5% to 60% by weight, preferably up to 50% by weight.

Suitable supports for a photosensitive recording material comprising the above-described photosensitive mixture comprise all materials which capacitors, semiconductors, multi-layer printed circuits or integrated circuits are made of or can be prepared from. Surfaces made of pure silicon and thermally oxidized and/or aluminum-coated silicon material, which, if desired, can also be doped, including all other supports customary in semiconductor technology, such as, for example, silicon nitride, gallium arsenide and indium phosphide, are particularly suitable. Further examples are the supports known from the production of liquid crystal displays, such as glass and indium/tin oxide. Metal sheets and foils, for example made of aluminum, copper, zinc; bimetallic or trimetallic foils, but also electrically non-conducting foils on which metal-vapors have been deposited, and, if desired, $SiO_2$ materials coated with aluminum and paper, are also suitable. These supports can be subjected to a high-temperature pretreatment, superficially grained, etched or treated with chemicals to achieve desirable properties, such as, for example, increased hydrophilicity.

In particular embodiment, the photosensitive mixture can contain an adhesion promoter for better adhesion in the resist or between the resist and the support. In the case of silicon or silicon dioxide supports, suitable adhesion promoters are of the aminosilane type, such as, for example, 3-aminopropyltriethyoxysilane or hexamethyldisilazane.

Examples of supports which can be used for the preparation of photomechanical recording layers, such as printing plates for letterpress printing, gravure printing, screen printing, intaglio printing and also for relief copies are aluminum plate:, which may be anodically oxidized, grained and/or silicatized aluminum plates, zinc plates, steel plates, which may have been treated with chromium, and also plastic sheets or paper.

The recording material according to the invention is subjected to imagewise exposure. Sources of actinic radiation are: metal halide lamps, carbon arc lamps, xenon lamps and mercury vapor lamps. It is also possible to perform exposure using high-energy radiation, such as laser, electron or X-ray radiation.

The layer thickness varies depending on the intended field of application. It is between about 0.1 and 100 $\mu$m, in particular between 0.3 and 10 $\mu$m.

The invention also relates to a process for the preparation of a photosensitive recording material. The photosensitive mixture can be applied to the support by spray-coating, flow-coating, roller-coating, spin-coating and di-coating. The solvent is then removed by evaporation leaving the photosensitive layer on the surface of the support. The removal of the solvent can, if necessary, be promoted by heating the layer to temperatures of up to 140.C. However, it is also possible initially to apply the mixture in the above-mentioned manner to an interim support, from which it is transferred to the ultimate support material under pressure and elevated temperature.

The layer is then subjected to imagewise exposure. Usually actinic radiation is used. For the irradiation, UV lamps are used which emit radiation having a wavelength of 100 to 500 nm. During the development of the photosensitive layer, a pattern is produced by treating the layer with a developing solution which dissolves or removes the irradiated regions of the photosensitive material.

The developers used are solutions of alkaline reagents, such as, for example, silicates, metasilicates, hydroxides, hydrogen phosphates and dihydrogen phosphates, carbonates and hydrogencarbonates, of alkali metal or alkaline earth metal, in particular of ammonium ions, but also ammonia and the like. Metal ion-free developers are described in US-A-4,729,941; EP-A-0,062,733; US-A-4,628,023; US-A-4,141,733; EP-A-0,097,282 and EP-A-0,023,758. The content of these substances in the developer solution is in general about 0.1% to 15% by weight, preferably 0.5% to 5% by weight, relative to the weight of the developer solution.

If necessary, the developed resist structures are cured. This is in general carried out by heating the resist structure on a hot plate up to a temperature below the flow temperature and then exposing it to the UV light of a xenon/mercury vapor lamp (range from about 200 to 250 nm) over the entire surface. This curing cross-links the resist structures so that the structures in general have a flow resistance up to temperatures of more than 200.C. The curing can also be carried out without increasing the temperature by irradiation with UV light. This is true especially if highenergy radiation is used, for example electron radiation.

The advantages offered by the mixture according to this invention wherein the described novolak resins are contained are illustrated more clearly by the examples which follow.

The Comparative Examples are based on:
(1) monoreactive alkylphenols (2,4-and 2,6-dimethylphenol), compared with the monoreactive 2,3,6-trimethylphenol employed in accordance with the invention, and
(2) a bireactive alkylphenol (2,3,5-trimethylphenol) which has the same number of substituents as the 2,3,6-trimethylphenol employed in accordance with the invention.

The comparative tests with above monoreactive novolak resins unexpectedly showed that the novolak resins employed in accordance with this invention not only possess the required thermal stability (measured by way of the glass transition temperature) but that they also result in a considerable reduced dark erosion rate. The test results are compiled in Table 1.

Compared with the bireactive 2,3,5-trimethylphenol, the use of the monoreactive, but also trisubstituted 2,3,6-trimethylphenol as a comonomer is distinguished by a more easily controllable preparation procedure of the novolak resins required for the photosensitive mixtures of this invention. This manifests itself in the relation between the viscosity (dynamic viscosity) of a novolak resin to be prepared and the amount of carbonyl compound used for the novolak preparation. Whereas relatively constant viscosity values are obtained when the mixtures contain 2,3,6-trimethylphenol as comonomers, even if the added amount of carbonyl compound is varied within a relatively wide range, there is a marked interdependence between the viscosity and the added amount of carbonyl compound when the mixtures contain 2,3,5-trimethylphenol. The results are compiled in Table 2.

During the industrial scale synthesis of novolak resins of this generic type, variations in the educt concentrations, and in particular locally different concentrations in the reaction vessel itself, occur quite frequently, and therefore components, which despite this risk yield products of constant, identical quality, are clearly preferable. A constant product quality is in particular required with regard to the field of application of the novolak resins, i.e., their use for photoresists, for photoresists must possess very specific, defined lithographic property profiles, which to a high degree depend on the novolak properties.

In the examples which follow parts by weight (p.b.w.) and parts by volume (p.b.v. bear the same relationship as g and cm³. Unless otherwise specified, percentages and quantitative ratios are expressed in terms of weight.

EXAMPLE 1

Preparation of the binder

In a four-necked flask equipped with a reflux condenser, dropping funnel and agitator, 295 g of m-cresol and 41.3 g of 2,3,6-trimethylphenol are dissolved in 193 ml of diethyleneglycol dimethyl ether, then 10 g of oxalic acid dihydrate are added and the mixture is heated to 100.C. 222 g of a 37% strength aqueous formaldehyde solution are dropwise added, and the reaction mixture is slowly refluxed for another six hours. Then water, solvent and non-reacted components are distilled off, distillation being first conducted at normal pressure up to 200° C. and then in a water jet vacuum up to 220° C. The hot novolak resin is poured into a cooling vessel and allowed to cool down.

The viscosity of the novolak resin is measured as the dynamic viscosity of a 40% strength solution of the novolak in methoxypropanol. It is 630 mPa.s (T=20° C.) and determined using a ball viscometer. The glass transition temperature of the novolak resin is 119° C. It is determined with the aid of a differential calorimeter (DSC 1090, made by Dupont) at a heating rate of 20 K/min and can be calculated from the temperature measured at half the height of the interval.

Application

Coating solutions are prepared from
(a) 12 p.b.w. of novolak resin described above,
2 p.b.w. of the reaction product obtained from 3 mol of 1,2.naphthoquinonediazide-5-sulfonylchloride and 1 mol of trihydroxybenzophenone, in
45 p.b.w of propylene glycol monomethyl ether acetate, and
(b) the components listed under (a) except that the tris-ester of 1,2,-naphthoquinonediazide-5-sulfonyl-chloride is replaced by the corresponding ester obtained from the -4-sulfonylchloride.

The resulting solutions are filtered through a 0.2 μm Millipore-filter and spin-coated onto silicon wafers provided with an adhesion-promoting coating (hexamethyl disilazane) such that resist layers having a thickness of 1 μm are obtained after drying in a convection oven for 30 minutes at 90°0 C.

To determine the dark erosion rate the coated silicon wafers are developed for 60 seconds in a 0.2 n, metal ion-free developer solution containing tetramethyl ammonium hydroxide. Then the remaining resist layer thicknesses are measurer with a Rudolph Film Thickness Monitor. The loss in layer thickness corresponds to the dark erosion rate (nm/min) of the photosensitive layer. The dark erosion rates measured in this case are 58 nm/min ior layer (a) and 47 nm/min for layer (b).

To determine the thermal stability the described photosensitive mixtures are applied to a silicon wafer provided with an adhesion-promoting layer, such that after drying at 90° C. for 30 minutes layer thicknesses of 1.7 μm are obtained. Then exposure of the layer to a pattern comprising 2 μm wide lines is performed with the aid of a projection aligner, and the exposed layer is developed with a commercially available aqueous-alkaline developer solution. To test the thermal stability of the resist patterns obtained in this way, the wafers are heated for 30 minutes to a temperature of 150° C., and to see whether any changes of the edge profiles can be detected. Neither the resist patterns produced in accordance with Examples 1 and 2 nor the resist patterns produced according to Comparative Examples 1 to 3 showed any changes of their edge profiles.

EXAMPLE 2

Preparation of the binder 432 g of m-cresol and 136 g of 2,3,6-trimethyl phenol are heated to 100° C., together with 300 g of di-ethylene glycol dimethyl ether and 11 g of oxalic acid dihydrate. Within one hour, 366 g of 37% strength aqueous formaldehyde solution (4.5 mol) are dropwise added, and the reaction mixture is slightly refluxed for another 15 hours. The further processing is carried out as described in Example 1.

The novolak resin has a viscosity of 495 mPa.s (40% strength, in methoxypropanol) and a glass transition temperature of 117° C.

Application

As described in Example (1b), a resist solution containing the binder of Example 2 is spin-coated onto a support and dried, and the dark erosion rate as a result of development with the metal ion-free developer of Example 1 is measured. It is 18 nm/min.

COMPARATIVE EXAMPLE 1

Preparation of the binder

Under the reaction conditions set forth in Example 1, a novolak resin having a viscosity of 615 mPa.s (40% strength, in methoxypropanol) and a glass transition temperature of 118° C. is prepared from a cresol/xylenol mixture comprised of m-cresol and 2,4-dimethyl phenol in a molar ratio 9:1, and formaldehyde.

Application

As described in Example 1, resist solutions containing the binder of Comparative Example 1 are spun onto supports and dried, and the dark erosion rates resulting after development with the metal ion-free free developer of Example 1 are determined. Dark erosion rates of 272 nm/min (a) and 351 nm/min (b) are measured.

COMPARATIVE EXAMPLE 2

Preparation of the binder

Under the reaction conditions set forth in Example 1, a novolak resin having a viscosity of 690 mPa.s (40% strength, in methoxypropanol) and a glass transition temperature of 116° C. is prepared by condensation from a cresol/xylenol mixture comprised of m-cresol and 2,6-dimethyl phenol in a molar ratio of 9:1, and formaldehyde.

Application

As described in Example 1 resist solutions containing the binder of Comparative Example 2 are prepared and processed, and the dark erosion rates are determined in accordance with Example 1. Dark erosion rates of 289 nm/min (a) and 365 nm/min (b) are measured.

COMPARATIVE EXAMPLE 3

Preparation of the binder

Under the reaction conditions set forth in Example 1, a novolak resin having a viscosity of 950 mPa.s (40% strength, in methoxypropanol) and a glass transition temperature of 123° C. is prepared from m-cresol and formaldehyde.

Application

The binders of Comparative Example 3 are employed for resist solutions and further processed as described in Example 1. The dark erosion rates are 249 nm/min (a) and 135 nm/min (b)

EXAMPLE 3

Analogously to the preparation of the novolak of Example 1, novolak resins are prepared by condensation of mixtures comprising 9 mol of m-cresol and 1 mol of 2,3,6-trimethyl phenol with varying amounts of formaldehyde (the molar ratios of phenol component:formaldehyde are given in table 2 below), employing oxalic acid as a catalyst. The viscosity values measured for each novolak (4% strength, in methoxypropanol) are also compiled in Table 2.

COMPARATIVE EXAMPLE 4

As described in Example 1, novolak resins are prepared by condensation of mixtures comprising 9 mol of m-cresol and 1 mol of 2,3,5-trimethylphenol with varying amounts of formaldehyde (the molar ratios of phenolic components:formaldehyde are given in Table 2 below). The viscosity values of the novolak resins (40% strength, in methoxyprolanol) are also compiled in Table 2.

It can be seen that the viscosities of novolak resins prepared employing 2,3,5-trialkylphenols along with m-cresol vary within a much wider range when the amount of formaldehyde is varied than do the viscosities of novolak resins prepared employing 2,3,6-trialkyl- phenols. Substantially constant viscosity values are in particular obtained when the added amount of formaldehyde varies between 0.85 and 0.95 mol, particularly between 0.89 and 0.92 mol per mol of phenolic component. Thus, the viscosity can be considered 'constant' when the range of variation (Δ) observed within the above limits of the added amount of formaldehyde does not exceed 200 mPa.s.

TABLE 1

| Novolak resin | Composition of phenol mixture (in mol %) | Viscosity, 40% in MP* (mPa × s) | Glass transition temp. (°C.) | Dark erosion rate (nm/min) | Thermal stability: Changes of edge profiles |
|---|---|---|---|---|---|
| Example 1 | 90 m-cresol 10 2,3,6-tri-methylphenol | 630 | 119 | (a) 58 (b) 47 | none |
| Example 2 | 80 m-cresol 20 2,3,6-tri-methylphenol | 495 | 117 | 18 | none |
| Comparative Example 1 | 90 m-cresol 10 2,4-dimethylphenol | 615 | 118 | (a) 272 (b) 351 | none |
| Comparative Example 2 | 90 m-cresol 10 2,6-dimethylphenol | 690 | 116 | (a) 289 (b) 365 | none |
| Comparative Example 3 | 100 m-cresol | 950 | 123 | (a) 249 (b) 135 | none |

*Methoxypropanol

TABLE 2

| Novolak resin | | Composition of cresol mixture (mol-%) | Added amount of formaldehyde (mol of CH$_2$O per mol of phenol comp.) | Viscosity of novolak (40%, in MP) |
|---|---|---|---|---|
| Example | 3 a | 90 m-cresol | 0.895 | 510 mPa × s |
| | 3 b | | 0.903 | 630 mPa × s |
| | 3 c | 10 2,3,6-tri-methylphenol | 0.910 | 625 mPa × s |
| | 3 d | | 0.918 | 690 mPa × s |
| Comp. Example | 4 a | 90 m-cresol | 0.860 | 500 mPa × s |
| | 4 b | | 0.868 | 550 mPa × s |
| | 4 c | 10 2,3,5-tri-methylphenol | 0.871 | 640 mPa × s |
| | 4 d | | 0.877 | 950 mPa × s |
| | 4 e | | 0.890 | 1,065 mPa × s |

What is claimed is:
1. A positive-working photosensitive mixture which comprises:
   (a) a photosensitive o-quinonediazide compound, and
   (b) a novolak resin binder which is insoluble in water and soluble in aqueous-alkaline media and which is a polymer of:
      (i) a carbonyl component, and
      (ii) a phenol component which consists essentially of a mixture of about 75–95 mol % of m-cresol and about 5–25 mol % of said 2,3,6-trialkylphenol,
and which is present in an amount sufficient to improve the thermal stability of the mixture and reduce the dark erosion rate of the mixture during development with a metal ion-free developer,
   wherein said mixture comprises about 50–100 parts by weight of said photosensitive o-quinonediazide compound per 100 parts by weight of said novolak resin binder.
2. A photosensitive mixture as claimed in claim 1, wherein said novolak resin binder has a glass transition temperature of at least 110° C.
3. A photosensitive mixture as claimed in claim 2, wherein said novolak resin binder has a glass transition temperature of at least 115° C.

4. A photosensitive mixture as claimed in claim 1, wherein said 2,3,6-trialkylphenol comprises ($C_1$-$C_3$)alkyl groups.

5. A photosensitive mixture as claimed in claim 4, wherein said 2,3,6-trialkylphenol is 2,3,6trimethylphenol.

6. A photosensitive mixture as claimed in claim 1, wherein the molar ratio of said initially added carbonyl-component to said initially added phenol component is about (0.80–0.93):1.

7. A photosensitive mixture as claimed in claim 1, wherein said photosensitive o-quinonediazide compound comprises an ester or amide of o-naphthoquinonediazide sulfonic acid or o-benzoquinonediazide sulfonic acid.

8. A photosensitive mixture as claimed in claim 8, wherein said photosensitive o-quinonediazide compound comprises an ester of o-naphthoquinone-diazide-4-sulfonic acid or o-naphthoquinonediazide-5-sulfonic acid with a mono-or polyhydroxybenzophenone or a mono-or polyhydroxyacylophenone.

9. A positive-working photosensitive recording material which comprises a support and a photosensitive layer comprising a photosensitive mixture as claimed in claim 1.

10. A recording material as claimed in claim 9, wherein said support has a surface which comprises silicon, silicon oxide, silicon nitride, gallium arsenide, indium phosphide, glass, indium/tin oxide, aluminum, copper, zinc, steel or chromium.

11. A recording material as claimed in claim 9, wherein said support has a surface which comprises a plastic or paper.

12. A recording material as claimed in claim 9, further comprising an adhesion promoter.

13. A recording material as claimed in claim 9, wherein said photosensitive layer has a thickness of about 0.1–100 μm.

14. A photosensitive mixture as claimed in claim 1, wherein said phenol component is prepared from a mixture comprising about 80–92 mol-% of m-cresol and about 8–20 mol-% of said 2,3,6-trialkylphenol.

* * * * *